United States Patent

[11] 3,568,081

[72] Inventor Balthasar H. Pinckaers
Edina, Minn.
[21] Appl. No. 758,276
[22] Filed Sept. 9, 1968
[45] Patented Mar. 2, 1971
[73] Assignee Honeywell, Inc.
Minneapolis, Minn.

[54] DIFFERENTIAL AMPLIFIER WITH PREDETERMINED DEADBAND
6 Claims, 3 Drawing Figs.

[52] U.S. Cl. .......... 330/30, 330/69
[51] Int. Cl. .......... H03f 3/68
[50] Field of Search .......... 330/30, 30 (D), 69, 24, 23

[56] References Cited

UNITED STATES PATENTS

| | | | |
|---|---|---|---|
| 2,780,682 | 2/1957 | Klein .......... | 330/69 |
| 3,381,142 | 4/1968 | Cook .......... | 330/30X |
| 3,271,528 | 9/1966 | Vallese .......... | 330/30 |

FOREIGN PATENTS

| | | | |
|---|---|---|---|
| 1,366,821 | 6/1964 | France .......... | 330/24X |

*Primary Examiner*—Roy Lake
*Assistant Examiner*—Lawrence J. Dahl
*Attorneys*—Lamont B. Koontz and Alfred N. Feldman

ABSTRACT: A differential amplifier, having a first and a second transistor, each transistor having two series-connected resistors connected to the collector, and having two output transistors; one of the output transistors having its base connected through a temperature compensating diode to the junction of the two resistors which are connected to the collector of the first differential amplifier transistor, and having its emitter connected to the collector of the second differential amplifier transistor; and the other of the output transistors having its base connected through a temperature compensating diode to the junction of the two resistors which are connected to the collector of the second differential amplifier transistor, and having its emitter connected to the collector of the first differential amplifier transistor.

INVENTOR.
BALTHASAR H. PINCKAERS
BY Francis A. Sirr
ATTORNEY.

DIFFERENTIAL AMPLIFIER WITH PREDETERMINED DEADBAND

BACKGROUND OF THE INVENTION

Prior art circuits are known which are sensitive to an input signal of variable magnitude and reversible sense, and which have a controllable deadband defining the magnitude of each sense of input signal to which the circuit will respond.

BRIEF SUMMARY OF THE INVENTION

My invention utilizes a differential amplifier having two amplifying devices, each with an output electrode. A first and a second impedance are connected in series to the output electrode of one of the amplifying devices. A third and a fourth impedance are connected in series to the output electrode of the other of the amplifying devices. A first output is derived from the sum of the voltage across one of the first and second impedances and an opposing voltage across both of the third and fourth impedances. A second output is derived from the sums of the voltage across one of the third and fourth impedances and an opposing voltage across both of the first and second impedances.

The relative magnitudes of the first, second, third and fourth impedances determines the magnitude of the abovementioned first and second outputs, and thus determines the switching deadband of the differential amplifier. The output may be provided by first and second switching means connected to be controlled by the first and second outputs.

DESCRIPTION OF THE PREFERRED EMBODIMENT

Figures 1, 2, 3:
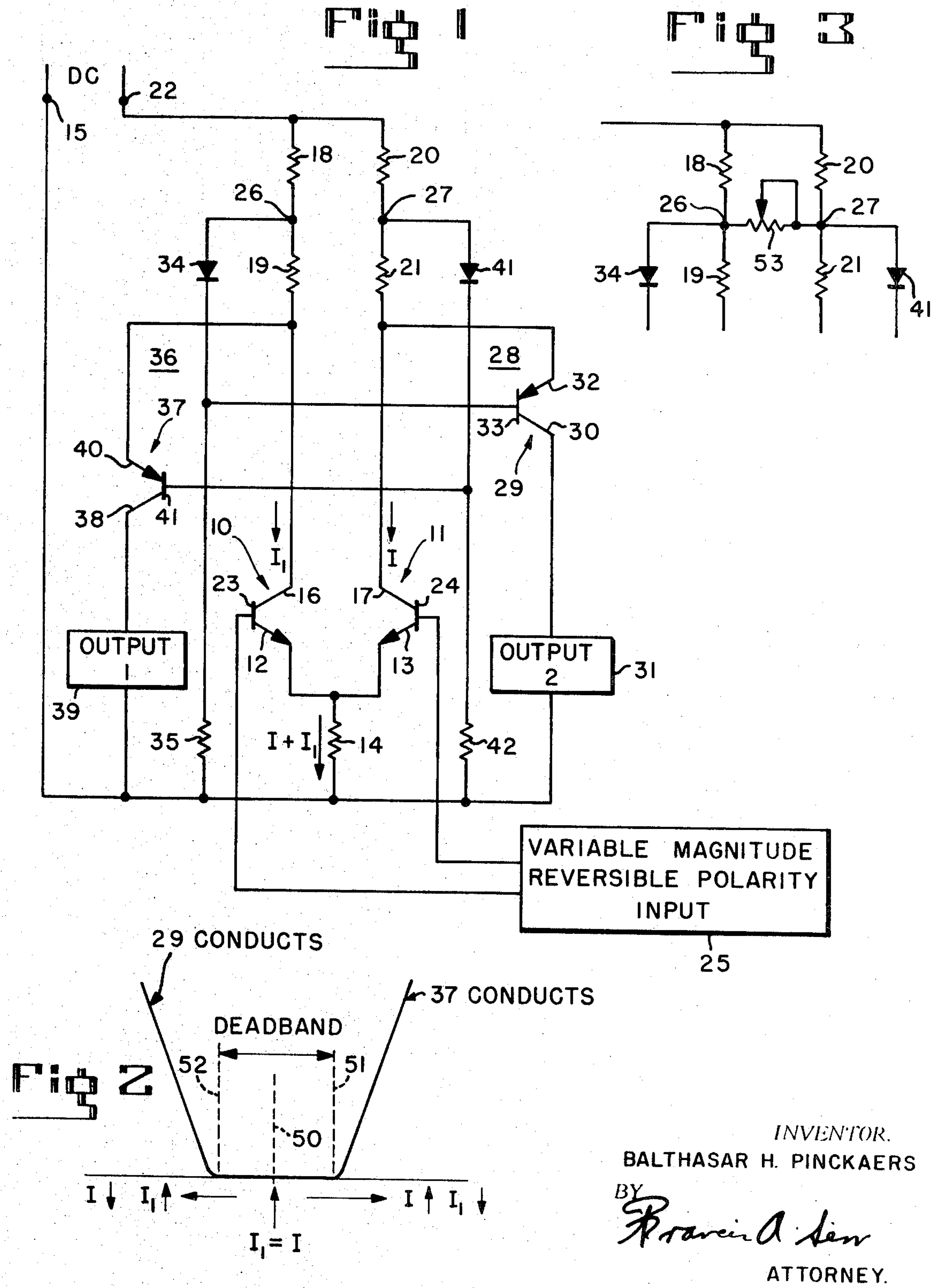
FIG. 1 is a schematic showing of the preferred embodiment of my invention.
FIG. 2 is a graph showing the deadband characteristic of the structure of FIG. 1.
FIG. 3 is a modification of a portion of the structure of FIG. 1.

Referring to FIG. 1, first and second amplifying devices in the form of transistors 10 and 11 constitute a differential amplifier. The common emitter electrodes 12 and 13 are connected through a common resistor 14 to a negative DC power supply terminal 15. The output collector electrodes 16 and 17 are connected through resistors 18, 19, 20 and 21 to a positive power supply terminal 22.

The input base electrodes 23 and 24 are connected to the terminals of a variable magnitude reversible polarity input 25.

In accordance with well-known operating characteristics of a differential amplifier, if the current flowing through resistor 14 is identified as I + I, and the collector-to-emitter current of transistor 10 is identified as I, then the collector-to-emitter current flow for transistor 11 is I. When no signal is presented to base electrodes 23 and 24, the biasing circuit components (not shown) may be selected such that $I_1$ is equal to I, that is, equal currents flow in the collector-to-emitter circuits of the two transistors 10 and 11.

If resistor 18 is selected equal to resistor 20 and resistor 19 is selected equal to resistor 21, then the voltages at terminals 26 and 27 are equal.

Reference numeral 28 identifies an output circuit means which includes transistor 29 having a collector 30 connected through an output means 31 to negative terminal 15 and having an emitter 32 connected through resistors 21 and 20 to positive terminal 22. The base electrode 33 of this transistor is connected through a temperature compensating diode 34 to junction 26 of resistors 18 and 19. The cathode of diode 34 is connected through resistor 35 to negative terminal 15.

Reference numeral 36 identifies a second output means which includes a transistor 37 having a collector electrode 38 connected through an output means 39 to negative terminal 15 and having an emitter electrode 40 connected through resistors 19 and 18 to positive terminal 22. The base electrode 41 of this transistor is connected through a temperature compensating diode 41 to the junction 27 of resistors 20 and 21. The cathode of diode 14 is connected through resistor 42 to negative terminal 15.

The state of conduction of transistors 29 and 37 is determined by the emitter-to-base voltage of these respective transistors. Considering transistor 29, the bias voltage can be determined by tracing a circuit from emitter 32 through the voltage rise across resistor 21, the voltage rise across resistor 20, the voltage drop across resistor 18, and the temperature compensating voltage drop across diode 34. Likewise, it can be seen that the bias voltage for transistor 37 consists of the voltage across resistors 18 and 19 as summed with the opposite polarity voltage resistor 20 and temperature compensating diode 41.

Referring to FIG. 2, this FIG. discloses a typical operating characteristic of the structure disclosed in FIG. 1. In this FIG., broken line 50 identifies the situation where the current $I_1$ flowing to the collector of transistor 10 is equal to the current I flowing to the collector of transistor 11. In this situation, both of the output transistors 29 and 37 are nonconductive. As disclosed in FIG. 2, the portion of the FIG. to the right of broken line 50 is that mode of operation wherein current I is increasing and current $I_1$ is decreasing. The mode of operation to the left of broken line 50 is for the contrary situation where current $I_1$ is increasing and current I is decreasing. As the current I increases, the voltage across resistors 20 and 21 increases while the voltage across resistors 18 and 19 decreases. Considering the emitter-to-base circuit of transistor 37, the decreasing voltage across resistors 18 and 19 and the increasing voltage across resistor 20 function to increase the positive potential level of emitter 40. As represented in FIG. 2, as I continues to increase and $I_1$ to decrease, the condition is reached at broken line 51 wherein the current I has increased and the current $I_1$ has decreased to the point where transistor 37 is first rendered conductive.

Likewise, considering the left-hand portion of FIG. 2, as current $I_1$ increases, the voltage across resistors 18 and 19 increases. As current I decreases, the voltage drop across resistors 20 and 21 decreases. Considering the emitter-to-base signal for transistor 29, the decreasing voltage across resistors 20 and 21 and the increasing voltage across resistor 18 is effective to increase the positive potential level of emitter 32 until, as represented by broken line 52, transistor 29 is first rendered conductive.

It can be shown that the area between broken lines 51 and 52, identified as the deadband, is a function of the magnitude of the resistors 18, 19, 20 and 21. Thus, a predetermined deadband can be achieved by selection of these resistors.

Emitter-to-base voltage changes on transistors 29 and 37 which may occur as a result of varying ambient temperatures are compensated for by corresponding changes in the forward voltage drop of diodes 34 and 41 respectively. Therefore the deadband is virtually unaffected by varying temperature and is only a function of resistors 18, 19, 20 and 21 and the current level ($I_1 + I$) in the differential amplifier.

Referring to FIG. 3, the junction points 26 and 27 of resistors 18, 19, 20 and 21 can be coupled by a variable resistance 53 to allow manual adjustment of the bandwidth of the deadband disclosed in FIG. 2.

I claim:

1. A differential amplifier comprising: a first and a second amplifying device, each having an input electrode, an output electrode, and a common electrode; circuit means including an impedance element connected to said common electrodes; a first and a second impedance connected in series with the output electrode of said first amplifying device; a third and a fourth impedance connected in series with the output electrode of said second amplifying device; first output circuit means conductively connnected to the junction of said first and second impedance and to the output electrode of said second amplifying device; second output circuit means conductively connected to the junction of said third and fourth impedance and to the output electrode of said first amplifying device; and a variable impedance connected from the junction of said first and second impedance to the junction of said third and fourth impedance.

2. A differential amplifier comprising: a first and a second amplifying device, each having an input electrode, an output electrode, and a common electrode; circuit means including an impedance element connected to said common electrode; a first and a second impedance connected in series with the output electrode of said amplifying device; a third and a fourth impedance connected in series with the output electrode of said second amplifying device; first output circuit means conductively connected to the junction of said first and second impedance and to the output electrode of said second amplifying device wherein said first output circuit means includes a third amplifying device having an input electrode, an output electrode and a common electrode, with the input electrode connected to said junction of said first and second impedance and with the common electrode connected to the output electrode of said second amplifying device; and second output circuit means conductively connected to the junction of said third and fourth impedance and to the output electrode of said first amplifying device wherein said second output circuit means includes a fourth amplifying device having an input electrode, an output electrode and a common electrode, with the input electrode connected to said junction of said third and fourth impedance and with the common electrode connected to the output electrode of said first amplifying device.

3. A differential amplifier comprising: a first and a second amplifying device, each having an input electrode, an output electrode, and a common electrode, wherein said first and second amplifying devices are transistors whose common electrodes are emitters, whose input electrodes are bases, and whose output electrodes are collectors; circuit means including an impedance element connected to said common electrodes; a first and a second impedance connected in series with the output electrode of said first amplifying device; a third and a fourth impedance connected in series with the output electrode of said second amplifying device; first output circuit means conductively connected to the junction of said first and second impedance and to the output electrode of said second amplifying device, wherein said first output circuit means includes a third transistor with a base connected to said junction of said first and second impedance and with the emitter connected to the collector of said second transistor; and second output circuit means conductively connected to the junction of said third and fourth impedance and to the output electrode of said first amplifying device, wherein said second output circuit means includes a fourth transistor with a base connected to said junction of said third and fourth impedance and with the emitter connected to the collector of said first transistor.

4. A differential amplifier as defined in claim 2 wherein said third and fourth amplifying devices are transistors, and wherein said first and second output circuit means each include temperature compensation diode means.

5. A differential amplifier as defined in claim 3 including a source of direct current having positive and negative terminal means; wherein the emitters of said first and second transistors are connected through said impedance element to said negative terminal means, and the collectors of said first and second transistors are respectively connected through said first and second impedance and said third and fourth impedance to said positive terminal means; wherein said first output circuit means includes a diode having an anode connected to said junction of said first and second impedance, and having a cathode connected to the base of said third transistor and through an impedance to said negative terminal means; and wherein said second output circuit means include a further diode having an anode connected to said junction of said third and fourth impedance, and having a cathode connected to the base of said fourth transistor and through a further impedance to said negative terminal means.

6. A differential amplifier as defined in claim 5 including a variable impedance connected from the junction of said first and second impedance to the junction of said third and fourth impedance.